US010886247B2

(12) United States Patent
Matsuda

(10) Patent No.: US 10,886,247 B2
(45) Date of Patent: Jan. 5, 2021

(54) POWER CONVERTER

(71) Applicant: Mitsubishi Electric Corporation, Tokyo (JP)

(72) Inventor: Yohei Matsuda, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/301,499

(22) PCT Filed: Nov. 8, 2016

(86) PCT No.: PCT/JP2016/083070
§ 371 (c)(1),
(2) Date: Nov. 14, 2018

(87) PCT Pub. No.: WO2017/208477
PCT Pub. Date: Dec. 7, 2017

(65) Prior Publication Data
US 2019/0296735 A1 Sep. 26, 2019

(30) Foreign Application Priority Data
Jun. 2, 2016 (JP) ................. 2016-110701

(51) Int. Cl.
H01L 23/00 (2006.01)
H01L 25/16 (2006.01)

(52) U.S. Cl.
CPC .............. *H01L 24/48* (2013.01); *H01L 25/16* (2013.01); *H01L 24/29* (2013.01); *H01L 24/32* (2013.01)

(58) Field of Classification Search
CPC . H03K 17/162; H02M 1/32; H01L 23/49844; H01L 23/645; H01L 29/2003
See application file for complete search history.

(56) References Cited

U.S. PATENT DOCUMENTS 5,237,296 A 8/1993 Mandai et al.
6,259,332 B1 * 7/2001 Hosoya ............... H03B 5/1852
331/107 SL
(Continued)

FOREIGN PATENT DOCUMENTS

DE 112014002405 T5 5/2016
EP 1128539 A2 8/2001
(Continued)

OTHER PUBLICATIONS

English Translation of JP-H11150126-A (Year: 1999).*
(Continued)

Primary Examiner — Changhyun Yi
(74) Attorney, Agent, or Firm — Sughrue Mion, PLLC; Richard C. Turner

(57) ABSTRACT

In order to suppress oscillation and malfunction of a switching element in a power converter, the power converter includes a switching element; and an oscillation suppression circuit having a stub which is electrically connected to a terminal of the switching element. A signal of the oscillation frequency is suppressed based on a length of the stub relative to a wavelength of the oscillation frequency. When an incident wave reflects from the open end of the stub, the reflected wave is out of phase with the incident wave, and the incident wave and the reflected wave cancel each other.

20 Claims, 4 Drawing Sheets

(56) References Cited

U.S. PATENT DOCUMENTS

| | | | |
|---|---|---|---|
| 6,373,731 B1 | 4/2002 | Iwamura et al. | |
| 2013/0001662 A1* | 1/2013 | Nishijima | H03F 1/56 |
| | | | 257/296 |
| 2016/0308523 A1* | 10/2016 | Otake | H01L 29/7802 |
| 2017/0077068 A1 | 3/2017 | Horio et al. | |
| 2018/0048306 A1 | 2/2018 | Otake et al. | |

FOREIGN PATENT DOCUMENTS

| | | | |
|---|---|---|---|
| JP | 4-299815 A | | 10/1992 |
| JP | 9-275303 A | | 10/1997 |
| JP | 2798051 B2 | | 9/1998 |
| JP | 11-150126 A | | 6/1999 |
| JP | H11150126 A | * | 6/1999 |
| JP | 2005-353728 A | | 12/2005 |
| JP | 2014-073958 A | | 4/2014 |
| JP | 2015-126342 A | | 7/2015 |

OTHER PUBLICATIONS

Communication dated May 31, 2019 from the European Patent Office in application No. 16904101.9.
International Search Report for PCT/JP2016/083070 dated Jan. 31, 2017 [PCT/ISA/210].

* cited by examiner

POWER CONVERTER

CROSS REFERENCE TO RELATED APPLICATIONS

This application is a National Stage of International Application No. PCT/JP2016/083070 filed Nov. 8, 2016, claiming priority based on Japanese Patent Application No. 2016-110701 filed Jun. 2, 2016.

TECHNICAL FIELD

The present invention relates to a power converter having a switching element.

BACKGROUND ART

A high-speed, low on-resistance switching element is used to increase the efficiency and reduce the size of a power converter. However, the higher the switching speed, the more susceptible to a circuit parasitic component, causing the problem of oscillation and malfunction of the switching element.

The high-speed, low on-resistance switching element is realized, for example, by utilizing the fact that floating capacitance, such as input capacitance Ciss or output capacitance Coss, of a switching element using a wide bandgap semiconductor, such as GaN (gallium nitride), is an order of magnitude smaller than that of a Si (silicon) MOSFET (Metal-Oxide-Semiconductor Field-Effect Transistor).

Meanwhile, as the floating capacitance is very small, a Q value is liable to increase, and impedance is extremely low at the resonant frequency between circuit parasitic inductance and the floating capacitance. Oscillation occurs between the drain and source and between the gate and source of the switching element at the timing of switching due to these two characteristics resulting from the floating capacitance being small, causing malfunction of and damage to the switching element.

GaN has been taken up as the switching element in the heretofore described example, but the same also applies to a Si MOSFET, a SiC (silicon carbide) MOSFET, or the like, as long as it is a switching element which realizes high-speed switching by reducing the floating capacitance. Also, the same also applies to the case in which the circuit parasitic inductance is large and the Q value is high, due to a circuit pattern, wiring, or the like, regardless to the kind of switching element.

In order to prevent this kind of malfunction or parasitic oscillation of the switching element, it is proposed to provide a control circuit (a gate diode) which includes a first MISFET whose drain is connected to a positive power terminal and a second MISFET whose drain is connected to an output terminal, wherein a current path through which to conduct current from the source to the gate of the first MISFET is formed between the gate and the source. Furthermore, in order to reduce a drain voltage surge, it is also proposed to connect a snubber capacitor between the positive power terminal and a negative power terminal. (Refer to PTL 1)

CITATION LIST

Patent Literature

PTL 1: JP-A-2015-126342

SUMMARY OF INVENTION

Technical Problem

In PTL 1, oscillation is suppressed by connecting a gate diode, such as a Zener diode or a Schottky barrier diode, between the gate and source of the switching element. However, this method has the problem of causing an occurrence of the loss of the diode or an increase in the loss of the switching element, leading to a decrease in the efficiency of the power converter and an increase in the size of a cooler for the switching element.

The invention, having been made to solve the heretofore described kind of problem, has for its object to obtain a power converter configured to suppress oscillation of a switching element while maintaining an increase in the efficiency, and a reduction in the size, of the power converter.

Solution to Problem

The power converter according to the invention includes a switching element; and an oscillation suppression circuit having a stub which is electrically connected to a terminal of the switching element.

Advantageous Effects of Invention

According to the invention, the oscillation suppression circuit having the stub is connected to a terminal of the switching element, and thereby it is possible to suppress oscillation and malfunction of the switching element without increasing the loss of the switching element.

DESCRIPTION OF EMBODIMENTS

Embodiment 1

Hereinafter, a description will be given, based on FIGS. 1 to 3, of a power converter according to Embodiment 1 of the invention.

Figure 1:
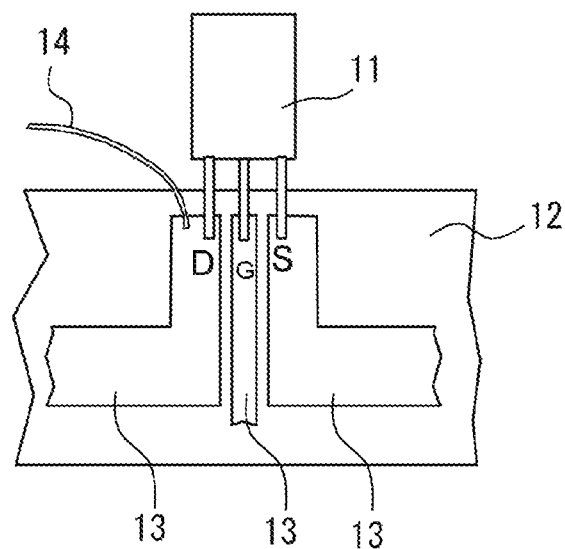
FIG. 1 is a basic configuration diagram of a power converter according to Embodiment 1 of the invention.

FIG. 1 shows a configuration diagram around a switching element used in the power converter of Embodiment 1, wherein a power converter, such as an inverter or a converter, is configured with a plurality of switching elements 11 connected, between a positive power terminal and a negative power terminal, in a half-bridge configuration or a full-bridge configuration.

In FIG. 1, the switching element 11, representing one of switching elements, such as MOSFETs, which configure the power converter, includes a drain terminal D, a source terminal S, and a gate terminal G. A plurality of substrate patterns 13 are formed on a circuit substrate 12 by printed wiring, and the drain terminal D, source terminal S, and gate terminal G of the switching element 11 are electrically connected one to each of the substrate patterns 13 by a solder or the like. One end of a wire 14 for a stub is electrically connected to the drain terminal D of the switching element 11, and the other end of the wire 14 for the stub is connected to nowhere and remains in an open state. Also, the length of the wire 14 for the stub is an odd multiple of ¼ wavelength of an oscillation frequency to be described later.

The stub is a distributed-constant line connected in parallel to a transmission line in a high-frequency circuit and acts as a capacitor or an inductor, as seen from an input port, depending on a termination load and on the ratio of a line length to a wavelength.

In order to describe the principle of oscillation suppression by the stub connected to the drain terminal D of the switching element 11, first, a description will be given of an oscillation principle in the case of no stub.

Figure 2:
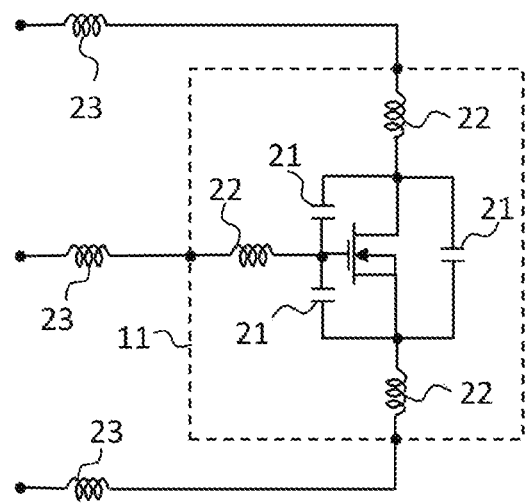
FIG. 2 is an equivalent circuit including parasitic components in and around a switching element configuring the power converter.

FIG. 2 shows an equivalent circuit including parasitic components in and around the switching element 11. The switching element 11 has floating capacitances 21 of the switching element and parasitic inductances 22, such as bonding wires and lead terminals, of the switching element. The substrate patterns 13 have parasitic inductances 23.

When the floating capacitances 21 between the drain and source of the switching element 11 are small, and the parasitic inductances 22 of the switching element 11 and the parasitic inductances 23 of the substrate patterns 13 are large, a Q value is high, and oscillation occurs between the drain and the source at the timing of switching.

An oscillation frequency f is determined by a parasitic inductance component L of one circuit formed of the switching element 11, the substrate patterns 13, and the like, and by a floating capacitance C between the drain and source of the switching element 11, and is obtained from the following expression (1).

[Mathematical 1]

Mathematical 1

$$f = 1/2\pi\sqrt{LC} \quad (1)$$

Also, a wavelength λ of the oscillation frequency f at that time is obtained from the following expression (2) using a propagation speed Co in vacuum.

[Mathematical 2]

Mathematical 2

$$\lambda = Co/f \quad (2)$$

Next, a description will be given of the principle of oscillation suppression by the stub. FIG. 3 shows a schematic diagram of the principle of oscillation suppression by the stub.

Figure 3:
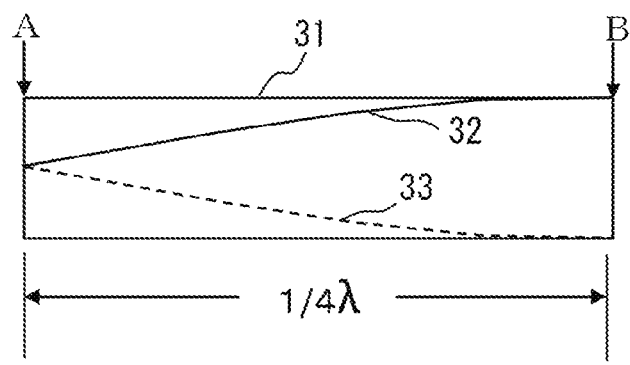
FIG. 3 is a principle diagram of oscillation suppression by a stub according to the invention.

In FIG. 3, 31 is the wire for the stub (the point A at the left end is the connection point between the wire 14 for the stub and the switching element 11, and the point B at the right end is the leading end of the wire 14 for the stub), 32 is an incident wave of the oscillation frequency, and 33 is a reflected wave. Also, the length of the wire 14 for the stub is set to ¼ wavelength of the oscillation frequency.

When oscillation occurs between the drain and source of the heretofore described switching element 11, a signal of the oscillation frequency enters the wire 14 for the stub from the connection point A between the switching element 11 and the wire 14 for the stub. As the length of the wire 14 for the stub is equivalent to ¼ wavelength of the oscillation frequency, the incident wave travels ¼ wavelength and reflects from the point B at the leading end of the wire 14 for the stub. As the leading end of the wire 14 for the stub is opened, the reflected wave is out of phase with the incident wave by 180 degrees, and the incident wave and the reflected wave annihilate each other. The oscillation frequency is cancel led on the above principle, and thus it is possible to suppress the oscillation of the switching element 11.

In this way, the wire 14 for the stub, as it suppresses the oscillation of the switching element 11, functions as an oscillation suppression circuit.

As the switching element 11, not only an MOSFET, but every power circuit switching element, such as an IGBT, can be used, and particularly, a wide bandgap semiconductor is preferable.

Also, the material of the switching element. 11 is not only Si (silicon), but may also be a wide gap semiconductor, such as SiC (silicon carbide) or GaN (gallium nitride).

Figure 4:
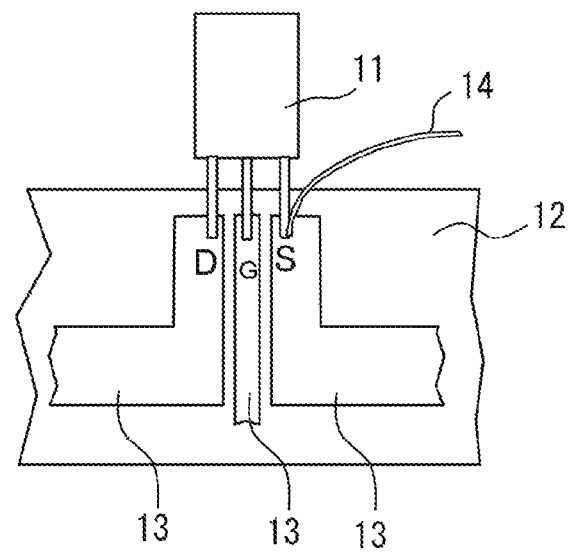
FIG. 4 is a basic configuration diagram in which is changed the connection of the stub of the power converter according to Embodiment 1 of the invention.

The wire 14 for the stub is connected to the drain terminal D, as heretofore described, but may be connected to the source terminal S of the switching element 11, as shown in FIG. 4.

Figure 5:
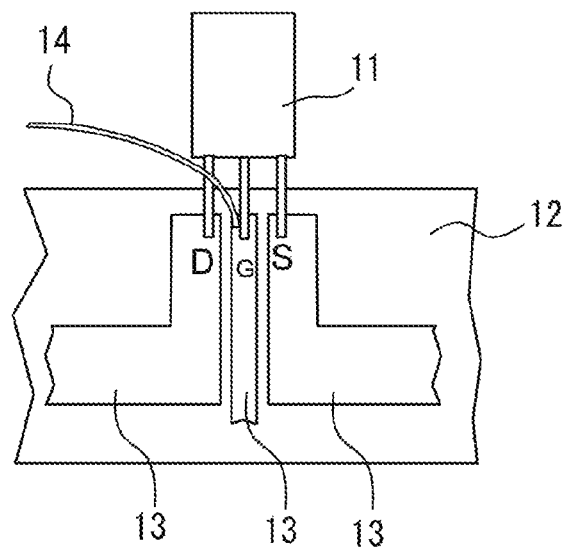
FIG. 5 is a basic configuration diagram in which is changed the connection of the stub of the power converter according to Embodiment 1 of the invention.

Also, when the floating capacitances between the gate and source of the switching element 11 are small and thus oscillation occurs between the gate and the source, the same advantageous effect can be obtained even when the wire 14 for the stub is connected to the gate terminal G of the switching element 11, as shown in FIG. 5.

As above, the invention of Embodiment 1 is such that simply by connecting the oscillation suppression circuit having the wire 14 for the stub to one of the drain, source, or gate of the switching element 11, it is possible to suppress oscillation or malfunction of the switching element 11 without increasing a snubber loss or a switching element loss.

Embodiment 2

Next, a description will be given, based on FIGS. 6 to 8, of a power converter according to Embodiment 2 of the invention.

Figure 6:
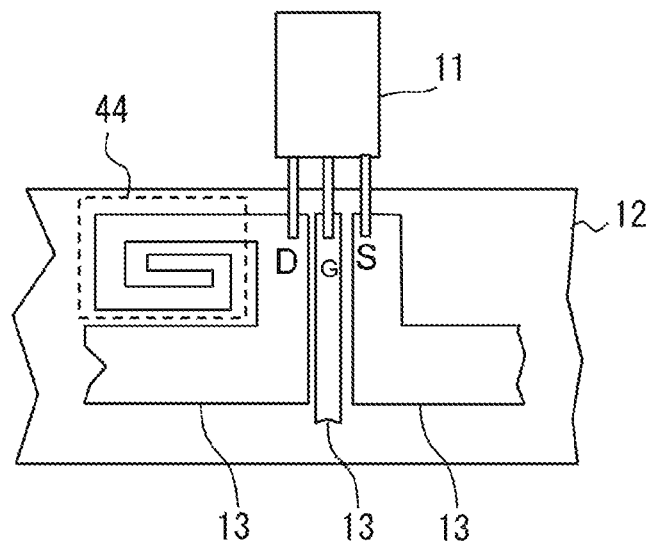
FIG. 6 is a basic configuration diagram of a power converter according to Embodiment 2 of the invention.
Figure 7:
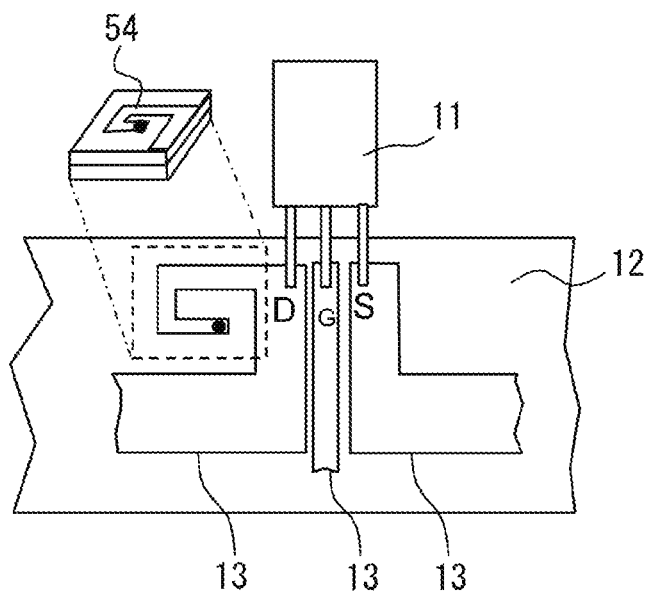
FIG. 7 is a basic configuration diagram of another configuration of the power converter according to Embodiment 2 of the invention.
Figure 8:
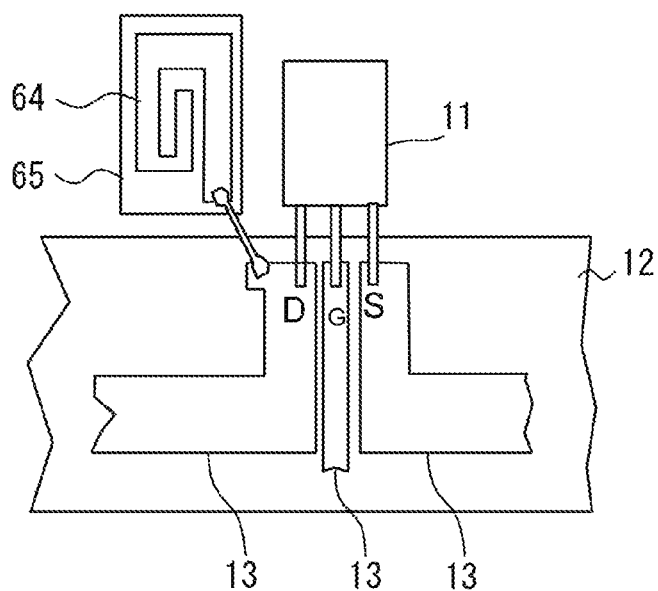
FIG. 8 is a basic configuration diagram of another configuration of the power converter according to Embodiment 2 of the invention.

FIGS. 6 to 8 each show a configuration diagram around a switching element used in the power converter of Embodiment 2, wherein a power converter, such as an inverter or a converter, is configured with a plurality of switching elements 11 connected, between a positive power terminal and a negative power terminal, in a bridge configuration. In FIGS. 6 to 8, identical signs are given to portions identical to or equivalent to those in FIG. 1, and a detailed description will be omitted.

First, in FIG. 6, the switching element 11, representing one of switching elements, such as MOSFETs, which configure the power converter, includes a drain terminal D, a source terminal S, and a gate terminal G. A plurality of substrate patterns 13 are formed on a circuit substrate 12, and the drain terminal 1), source terminal S, and gate terminal G of the switching element 11 are electrically connected one to each of the substrate patterns 13 by a solder or the like. The heretofore described configuration is the same as in FIG. 1 of Embodiment 1.

The stub of Embodiment 1 is configured of the wire 14 electrically connected to a terminal of the switching element 1, but the stub of Embodiment 2 is configured as a substrate pattern 44 for the stub in one substrate pattern 13 to which to connect the drain terminal D of the switching element 11.

As shown in FIG. 6, the substrate pattern 44 for the stub is configured by extending the substrate pattern 13 to which to connect the drain terminal D and forming a spiral circuit pattern.

The leading end of the substrate pattern 44 for the stub is in an open state, and the length of the substrate pattern 44 is an odd multiple of ¼ wavelength of an oscillation frequency.

The substrate pattern 44 for the stub, by being configured in this way, functions as an oscillation suppression circuit which suppresses oscillation of the switching element 11, and is configured as one substrate pattern, and so it is possible to suppress the area occupied on the circuit substrate 12, making it effective to reduce the size of the power converter.

Furthermore, in order to achieve the reduction in size, a substrate pattern 54 may be configured by forming a substrate pattern using a plurality of layers and connecting the individual layers with a through hole, as shown in FIG. 7. Furthermore, as in FIG. 7, the substrate pattern 54 is such that spiral circuit patterns are multi-layered in the substrate, thereby configuring a helical pattern, and thus that the area occupied on the front surface of the substrate is suppressed, making it effective to reduce the size of the power converter.

Also, when configuring the stub in a substrate pattern, as shown in A. 8, the substrate pattern may be configured as a substrate pattern 64 for the stub on a substrate 65 separate from the circuit substrate 12 on which the switching element 11 is mounted, and configured by electrically connecting the substrate pattern 64 for the stub to the substrate pattern 13.

When configuring the substrate pattern 64 for the stub on the separate substrate 65, a separate substrate for which is used a base material with a higher dielectric constant than that of the circuit substrate 12 on which the switching element 11 is mounted is used, and thereby the wavelength of the oscillation frequency is shortened, enabling the length of the stub to be shortened. Because of this, it is possible to suppress the area occupied on the substrate, making it effective to reduce the size of the power converter. A wavelength λa of the oscillation frequency is obtained from the following expression (3) using the oscillation frequency f, the speed Co, and an apparent dielectric constant εr of the base material.

[Mathematical 3]

Mathematical 3

$$\lambda a = Co/f\sqrt{\varepsilon r} \quad (3)$$

Also, when configuring the substrate pattern 64 for the stub on the separate substrate 65, a substrate whose base material is smaller in thickness than the circuit substrate 12 on which the switching element 11 is mounted is used, and thereby the wavelength of the oscillation frequency is shortened, enabling the length of the stub to be shortened. Because of this, it is possible to suppress the area occupied on the substrate, making it effective to reduce the size of the power converter.

FIGS. 6 to 8 show examples in which the substrate patterns 44, 54, and 64 for the stub are each connected to the substrate pattern 13 to which to connect the drain terminal D of the switching element 11, but the substrate patterns 44, 54, and 64 may each be connected to the substrate pattern 13 to which to connect the source terminal S or gate terminal G of the switching element 11, as also described in Embodiment 1.

The embodiments of the invention have been described above, but the invention not being limited to the embodiments, a variety of design changes can be carried out, and it is possible to freely combine the individual embodiments, and to appropriately modify or omit any of the individual embodiments, within the scope of the invention.

The invention claimed is:

1. A power converter, comprising:
    a switching element; and
    an oscillation suppression circuit having a stub which is electrically connected to a terminal of the switching element,
    wherein the terminal is directly connected to the stub,
    the stub has a length of an odd multiple of ¼ wavelength of an oscillation frequency, and a leading end thereof opened.

2. The power converter according to claim 1, wherein the oscillation suppression circuit is electrically connected to a drain terminal of the switching element.

3. The power converter according to claim 1, wherein the oscillation suppression circuit is electrically connected to a source terminal of the switching element.

4. The power converter according to claim 1, wherein the oscillation suppression circuit is electrically connected to a gate terminal of the switching element.

5. The power converter according to claim 1, wherein the stub is configured of a wire.

6. The power converter according to claim 1, wherein the stub is configured of a substrate pattern configured of a plurality of layers including a first pattern on a first layer and a second pattern on a second layer, wherein the first pattern and the second pattern are connected with a through hole.

7. The power converter according to claim 6, wherein the first pattern and the second pattern together form a helical pattern.

8. The power converter according to claim 6, wherein the substrate pattern is configured on a second substrate separate from a circuit substrate on which the switching element is mounted.

9. The power converter according to claim 8, wherein a base material of the second substrate separate from the circuit substrate has a higher dielectric constant than the base material of the circuit substrate on which the switching element is mounted.

10. The power converter according to claim 8, wherein the base material of the second substrate separate from the circuit substrate is smaller in thickness than the base material of the circuit substrate on which the switching element is mounted.

11. The power converter according to claim 1, wherein the switching element is a wide bandgap semiconductor.

12. The power converter according to claim 1, wherein the stub and the terminal are connected at a connection point.

13. The power converter according to claim 1, wherein a distance from a connecting end of the stub to the terminal of the switching element is substantially less than a wavelength, wherein the wavelength corresponds to an oscillation frequency.

14. The power converter according to claim 1, wherein the stub is configured as a distributed-constant line at an oscillation frequency.

15. The power converter according to claim 1, wherein a drain, a source and a gate of the switching element include parasitic inductance, the stub is configured to suppress parasitic oscillation at an oscillation frequency arising from the parasitic inductance, a distance from a connecting end of the stub to the terminal is configured to be substantially less than a wavelength, and the wavelength corresponds to the oscillation frequency.

16. A power converter, comprising:
a switching element; and
an oscillation suppression circuit having a stub which is electrically connected to a terminal of the switching element, wherein a distance from a connecting end of the stub to the terminal of the switching element is substantially less than a wavelength, wherein the wavelength corresponds to an oscillation frequency.

17. The power converter according to claim 16, wherein the substrate pattern is configured on a substrate separate from a circuit substrate on which the switching element is mounted.

18. The power converter according to claim 17, wherein a base material of the substrate separate from the circuit substrate has a higher dielectric constant than the base material of the circuit substrate on which the switching element is mounted.

19. The power converter according to claim 17, wherein the base material of the substrate separate from the circuit substrate is smaller in thickness than the base material of the circuit substrate on which the switching element is mounted.

20. A power converter, comprising:
a switching element; and
an oscillation suppression circuit having a stub which is electrically connected to a terminal of the switching element, wherein the stub is configured of a substrate pattern configured of a plurality of layers including a first pattern on a first layer and a second pattern on a second layer, and the first pattern and the second pattern are connected with a through hole, wherein the first pattern and the second pattern together form a helical pattern.

* * * * *